United States Patent [19]

Matsumoto et al.

[11] 4,292,156
[45] Sep. 29, 1981

[54] METHOD OF MANUFACTURING SEMICONDUCTOR DEVICES

[75] Inventors: Takashi Matsumoto; Takahiro Nawata, both of Kawasaki, Japan

[73] Assignee: VLSI Technology Research Association, Kawasaki, Japan

[21] Appl. No.: 15,897

[22] Filed: Feb. 28, 1979

[30] Foreign Application Priority Data

Feb. 28, 1978 [JP] Japan .................................. 53-23086

[51] Int. Cl.³ .................. H01L 21/316; H01L 21/318
[52] U.S. Cl. ............................. 204/192 EC; 29/578; 29/580; 156/643; 156/649; 156/657; 156/661.1; 156/662; 204/192 E; 427/93; 427/94
[58] Field of Search .................... 204/192 E, 192 EC; 156/643, 649, 661, 662, 657; 29/580, 578; 427/82, 93, 94

[56] References Cited

U.S. PATENT DOCUMENTS

| | | | |
|---|---|---|---|
| 3,675,314 | 7/1972 | Levi | 29/578 |
| 3,721,592 | 3/1973 | DeWerdt | 156/661 X |
| 3,958,040 | 5/1976 | Webb | 427/94 |
| 3,961,999 | 6/1976 | Antipov | 148/175 |

OTHER PUBLICATIONS

E. Bassous et al., Topology of Silicon Structures With Recessed SiO₂, *J. Electrochem. Soc.*, vol. 123, No. 11, (Nov. 1976), pp. 1729–1737.
T. Saki et al., Stepped Electrode Transistor–SET, Japanese Journal of Applied Physics, vol. 16, (1977), Supplement 16-1, pp. 43–46.

*Primary Examiner*—Delbert E. Gantz
*Assistant Examiner*—William Leader
*Attorney, Agent, or Firm*—Staas & Halsey

[57] ABSTRACT

A method of manufacturing a semiconductor device which has a thick insulating layer on a region for isolating semiconductor circuit elements from one another on a semiconductor substrate. This region of the substrate is selectively etched by using an insulating layer to leave the unetched part of the substrate in a mesa like shape, then, an anti-oxidation masking layer is formed on the sides of the insulating layer and the sides of the mesa shaped part and, after that, the thick insulating layer is formed by an oxidation treatment.

8 Claims, 8 Drawing Figures

METHOD OF MANUFACTURING SEMICONDUCTOR DEVICES

BACKGROUND OF THE INVENTION

1. Field of the Invention

The present invention relates to a method of manufacturing semiconductor devices, and more particularly to an improved method of forming a field insulating layer which isolates circuit elements therebetween.

2. Description of the Prior Art

In a process for manufacturing a semiconductor device of the prior art, a large height difference is created between the surface of the silicon dioxide layer, formed on a region for isolating semiconductor circuit elements from one another, and the surface of one of the elements. Accordingly, in order to prevent the large height difference from occurring, a so-called Planox process and a LOCOS (Local Oxidation of Silicon) process have been suggested. According to the Planox process, firstly, a region, in which a semiconductor circuit element is to be formed, of a silicon semiconductor substrate is selectively masked with a silicon nitride layer, then, an unmasked region of the substrate is oxidized to form a thick field oxide layer. After that, the mask of the layer of silicon nitride is removed and, finally, in the exposed region a semiconductor circuit element, for example, a transistor element, is formed. The LOCOS process consists of steps similar to the above-mentioned steps in the Planox process. In a semiconductor device manufactured by the Planox and LOCOS processes, a silicon dioxide layer on a region for isolating the circuit elements from one another is formed thick enough that the capacitance between the semiconductor substrate and conductive metal layers to be formed on the thick silicon dioxide layer is decreased. In particular a semiconductor device manufactured by applying the Planox process has a small height difference between the surfaces of the semiconductor substrate and silicon dioxide layer. Thus it is possible to prevent each of the conductive metal layers from breaking.

However, when selective oxidation of the silicon semiconductor substrate is carried out by heating at an elevated temperature in the above mentioned processes, the silicon nitride layer masking the region of the substrate, generates strain in the masked region of the substrate. This strain causes a lattice-defect in the silicon in the region of the substrate where the circuit element is to be formed. Moreover, during the selective oxidation of the silicon substrate, the formed silicon dioxide penetrates deeply under the silicon nitride layer, namely. Thus a so-called bird beak is formed and the region for forming the circuit element becomes narrow.

SUMMARY OF THE INVENTION

An object of the present invention is to provide a method for manufacturing a semiconductor device in which the above-mentioned drawbacks are mitigated.

According to the present invention, there is provided a method for manufacturing a semiconductor device which comprises the steps of: selectively masking a region of, for example, a silicon semiconductor substrate with an insulating layer (e.g. silicon dioxide or alumina), in which region a semiconductor circuit element is to be formed; etching the unmasked region of the semiconductor substrate to form the unetched part of the substrate into a mesa like shape; forming an anti-oxidation masking layer (e.g. silicon nitride) on the sides of the insulating layer and the mesa shaped part; oxidizing the unmasked semiconductor substrate to form a field oxide layer (e.g. silicon dioxide); removing the insulating layer from the region of the semiconductor substrate; removing the anti-oxidation masking layer, and; forming a transistor circuit in the region of the semiconductor substrate. The formation step of the anti-oxidation masking layer comprises the steps of: forming an anti-oxidation masking layer on the entire surface of both the insulating layer and semiconductor substrate; bombarding the anti-oxidation masking layer with ions from a direction at almost a right angle to the surface of the substrate; and selectively etching the anti-oxidation masking layer with an etching agent to leave a part of the anti-oxidation masking layer on the sides of the insulating layer and the mesa shaped part of the substrate.

BRIEF DESCRIPTION OF THE DRAWINGS

The invention and its object and features will become apparent during the course of the detailed description set forth below, which is rendered with reference to the accompanying drawings in which.

DETAILED DESCRIPTION OF THE PREFERRED EMBODIMENTS

Embodiments of the method according to the invention of manufacturing a semiconductor device will now be described.

Figure 1:
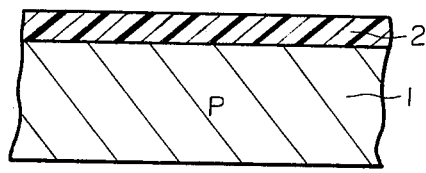
FIGS. 1 through 8 are schematic, cross-sectional views of a semiconductor device in various stages of its manufacture by a method in accordance with the invention.
Figure 2:
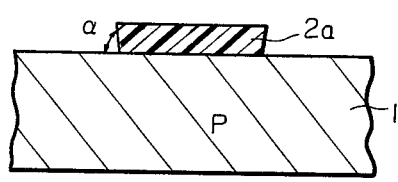

As illustrated in FIG. 1, an insulating layer 2, e.g. a silicon dioxide layer of from 1.0 to 1.5 $\mu$m in thickness, is formed on a surface of a silicon semiconductor substrate 1 of one conductivity type, in this case P-type, by a conventional thermal-oxidation process or chemical vapor deposition process. It is also possible to make the insulating layer of alumina. Next, as illustrated in FIG. 2, the insulating layer 2 formed on the silicon semiconductor substrate 1 is selectively etched in a conventional manner, for example, by means of a conventional photo-resist process for producing a masking pattern of a photo-resist (not shown). After a suitable etching process using the masking pattern of the photo-resist is performed, a part 2a of the insulating layer remains on a region of the silicon substrate 1. This is where a semiconductor circuit element is to be formed. When the selective etching of the insulating layer is carried out, it is preferable to create an angle ($\alpha$), which is smaller than a right angle (90°) between the surface of the silicon substrate 1 and the side of the remaining insulating layer 2a. The preferable range of this angle is from 40 through 80 degrees. The part 2a may also be formed so that an inverted mesa like shape is produced. If an insulating layer of silicon dioxide is used, an ion-etching process can be used as the suitable etching process. In order to create the angle "$\alpha$" between the surface of the substrate 1 and the side of the insulating layer 2a, the ion-etching process is carried out in such a manner that ion current generated in an ion-etching apparatus impinges on the insulating layer 2 from the predetermined angle "$\alpha$". The angle is kept constant in spite of movement of the substrate. In order to create the movement of the substrate, it is preferable to make the substrate rotate on its central axis and simultaneously revolve around the axis of the ion current. If the ion-etching of the insulating layer is carried out on a plurality of the semiconductor substrates, it is advisable to incline the supporting plate for the semiconductor substrates with respect to the axis of the ion current at such an angle that the ion current impinges on the substrates at the angle "α". It is also advisable to make the substrate rotate on its central axis and revolve around the axis of the ion current, simultaneously.

Figure 3:
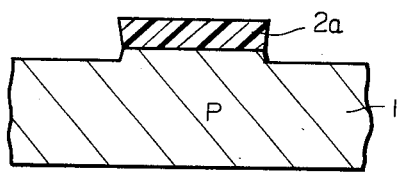
Figure 4:
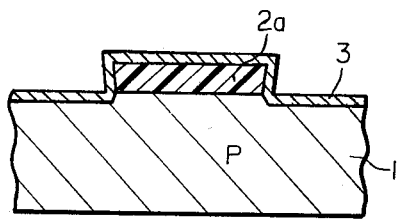

As illustrated in FIG. 3, after the selective etching of the insulating layer 2, the silicon semiconductor substrate 1, except for the region masked with the layer 2a, is etched in an amount of from 0.1 to 0.5 μm in thickness. Thus, the masked region of the substrate 1 remains shaped like a mesa. Then, as illustrated in FIG. 4, a silicon nitride ($Si_3N_4$) layer 3, of from 0.05 to 0.2 μm in thickness, is formed as an anti-oxidation masking layer on all the exposed surfaces of the silicon semiconductor substrate 1 and the remaining insulating layer 2a. After that, in order to increase the etching rate of the silicon nitride layer 3, the silicon nitride layer 3 is bombarded with ions, for example, argon ions, from a direction at almost a right angle to the surface of the silicon semiconductor substrate 1. As a result of the direction of bombardment, the part of the silicon nitride layer 3 located on the side of the remaining insulating layer 2a and on the side of the mesa shaped part of the substrate, is bombarded with a smaller amount of ions than the rest of the layer 3.

It should be noted here that, if necessary, a silicon dioxide layer, of from 0.01 to 0.05 μm in thickness, may be additionally formed under the silicon nitride layer 3. For example, when the etching of the silicon nitride layer 3 is carried out by a plasma-etching process, the additional silicon dioxide layer protects the silicon substrate surface in the region for isolating circuit elements from one another.

Figure 5:
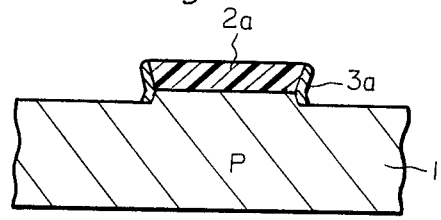

As illustrated in FIG. 5, the silicon nitride layer 3 is next etched to the extent that only the part 3a of the silicon nitride layer 3 located on the sides of the insulating layer 2a and the mesa shaped part of the substrate 1 is left. The part 3a of the silicon nitride layer remains after the etching because the etching rate of the part 3a is slower than that of the rest of the silicon nitride layer 3, which is bombarded with a larger amount of the ions.

Figure 6:
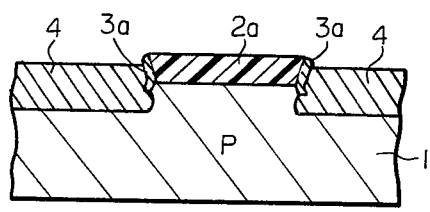

As illustrated in FIG. 6, a field oxide layer 4, i.e. a silicon dioxide layer, of 0.5 to 1.5 μm thickness, is next formed on the exposed surface of the semiconductor substrate 1 by oxidation treatment. The formed silicon dioxide layer 4 becomes an oxide layer on a region for isolating semiconductor circuit elements, i.e., a so-called field oxide layer. Furthermore, since the region of the semiconductor substrate 1 where the circuit element is to be formed, is already covered with the insulating layer 2a, during the oxidation treatment this covered region of the semiconductor substrate 1 is not essentially oxidized.

Figure 7:
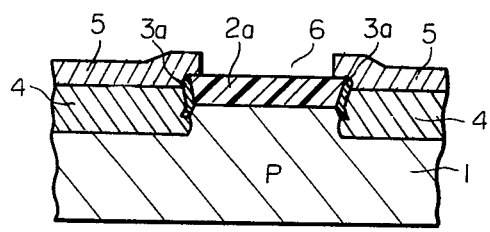

Referring to FIG. 7, after a photo-resist 5 is applied over the entire surfaces of both of the mask layer 2a and the field oxide layer 4, a window 6 is opened in a certain part of the photo-resist which lays over the region for forming the circuit element. The size of the window 6 is slightly smaller than the area of the region for forming the circuit element. Then, using the photo-resist 5 as a mask, the insulating layer 2a is removed by etching.

Figure 8:
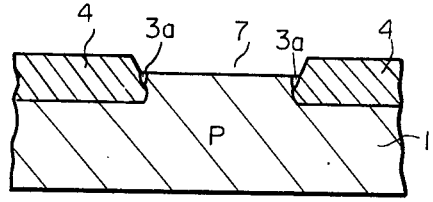

Thereafter, as illustrated in FIG. 8, the photo-resist is removed and, subsequently, the remaining part 3a of the silicon nitride layer is removed by etching. When the etching of the part 3a of the silicon nitride layer is carried out, a small portion of the part 3a of the silicon nitride layer may remain. In addition, the etching process of only silicon nitride, i.e. the selective etching process, can be carried out by using an ion-milling method.

Finally, in the exposed region 7 (FIG. 8) of the silicon semiconductor substrate 1, a certain transistor circuit element, for example, an N-channel type metal oxide semiconductor field effect transistor (MOS FET) circuit element (not shown) is formed in a conventional manner.

Usually a plurality of transistors will simultaneously be provided in a silicon semiconductor substrate after which the substrate is subdivided.

EXAMPLE

A P-type silicon substrate 1 (FIG. 1) having a resistivity of, 10 Ohm-cm, and a thickness of 300 μm was used as the starting material.

A silicon dioxide layer 2 of 1.5 μm thickness was formed on the silicon substrate 1 by a thermal oxidation process. The silicon substrate was heated at a temperature of 1200° C. in a flow of steam, until the desired thickness of the silicon dioxide layer was obtained.

The silicon dioxide layer 2 was selectively etched by means of a conventional photo-resist process to produce a predetermined photo-resist masking pattern and an ion-etching process using the photo-resist masking pattern to leave a predetermined part 2a (FIG. 2) of the silicon dioxide layer 2. The area of the part 2a corresponded to a region of the silicon substrate where a semiconductor circuit element was to be formed. The size of the remaining silicon dioxide layer 2a was 20 μm by 20 μm. The angle (α) between the surface of the silicon substrate 1 and the side of the remaining silicon dioxide layer 2a was 60 degrees.

The silicon substrate 1, except for the region covered by the remaining silicon dioxide layer 2a, was etched to remove 0.4 μm of the upper part of the silicon substrate 1. Thus, the unetched part of the substrate 1 was formed into a mesa like shape as illustrated in FIG. 3.

A silicon nitride layer 3 (FIG. 4) of 0.1 μm was formed on the surfaces of both the silicon substrate 1 and the silicon dioxide layer 2a in a conventional manner by bringing a gas mixture of silane and ammonia into contact with the surfaces. The silicon nitride layer 3a was bombarded with argon ions from a direction at a right angle to the surface of the silicon substrate 1.

The silicon nitride layer 3 was selectively etched by an etching agent which consisted of a solution of phosphoric acid. The etching agent corroded the part of the silicon nitride layer 3 which was bombarded with a large amount of argon ions, much more rapidly than the part of the layer 3 which was bombarded with a small amount of argon ions, so that the part 3a (FIG. 5) of the silicon nitride layer remained on the sides of the remaining silicon dioxide layer 2a and the mesa shaped part of the substrate 1.

The silicon substrate 1 was then heated at a temperature of 1200° C. in a flow of steam, until a field silicon oxide layer 4 (FIG. 6) of 1.0 μm was formed thereon.

A photo-resist 5 (FIG. 7) was applied over the silicon dioxide layers 2a and 4. A window 6 was opened in the photo-resist on the silicon dioxide layer 2a. The size of the window 6 was 16 μm by 16 μm.

The silicon dioxide layer 2a was removed by using an etching agent which consisted of a solution of hydrofluoric acid. This etching agent corroded the silicon oxide much more rapidly than silicon nitride. The photo-resist was removed. The silicon nitride layer 3a was then removed by using the etching agent for silicon nitride.

Thus the region 7 of the silicon substrate 1 where a semiconductor circuit element was to be formed, was exposed (as shown in FIG. 8). Thereafter, an MOS FET circuit element was provided in the region 7 in a conventional manner.

According to the above-mentioned method of the present invention, when an oxidation treatment of a region for isolating semiconductor circuit elements from one another is carried out, (a) the silicon nitride layer remaining as a mask is small, so that little strain is generated at an end portion of a region of the semiconductor substrate where the circuit element is to be formed and, (b) a so-called bird beak is hardly formed.

Furthermore, in a case where an MOS transistor circuit element is formed in a region of a semiconductor substrate where a semiconductor circuit element is to be formed, according to the method of the present invention, a silicon nitride layer does not directly cover the region. Therefore, defects in the substrate surface in the region are not caused by the silicon nitride layer, so that the electrical properties of the MOS transistor are not deteriorated. Such defects are, for example, a lattice-defect of silicon and an injection of undesirable impurities out of the silicon nitride into the substrate.

It will be obvious that the present invention is not restricted to the embodiments described and that many variations are possible for those skilled in the art without departing from the scope of this invention. For example, a diffusion of a channel stopper can be carried out simultaneously with the oxidation of a region for isolating semiconductor circuit elements from one another. A material masking against oxidation other than silicon nitride may be used. Furthermore, the idea of the present invention can be applied to the fabrication of a bipolar transistor.

What is claimed is:

1. A method of manufacturing a semiconductor device comprising the steps of:
   selectively masking a region of a silicon semiconductor substrate with an insulating layer of silicon dioxide, in which region a semiconductor circuit element is to be formed;
   etching the unmasked region of said silicon semiconductor substrate to form the unetched part of said silicon semiconductor substrate into a mesa like shape;
   forming an anti-oxidation masking layer over the entire surface of both of said insulating layer and said silicon semiconductor substrate;
   bombarding said anti-oxidation masking layer with ions from a direction which is almost at a right angle to the surface of said silicon semiconductor substrate;
   selectively etching said anti-oxidation masking layer to leave a part of said anti-oxidation masking layer on the sides of said insulating layer and on the sides of said mesa shaped part of said silicon semiconductor substrate;
   oxidizing the unmasked region of said silicon semiconductor substrate to form a silicon dioxide field oxide layer;
   removing said insulating layer from said region of said silicon semiconductor substrate in which said circuit element is to be formed, thereby exposing said region;
   removing said anti-oxidation masking layer; and
   forming said circuit element in said exposed region.

2. A method according to claim 1, wherein in said step of etching said unmasked region of said silicon semiconductor substrate, said unmasked region is etched in an amount of from 0.1 to 0.5 μm in thickness.

3. A method according to claim 1, wherein said anti-oxidation masking layer comprises silicon nitride.

4. A method according to claim 1, wherein the thickness of said silicon dioxide field oxide layer is in the range of from 0.5 to 1.5 μm.

5. A method according to claim 1, wherein the step of removing said insulating layer comprises the steps of:
   applying a photoresist on all the surfaces of said insulating layer and said silicon dioxide field oxide layer;
   opening a window having a smaller size than that of said insulating layer in the photoresist on said insulating layer; and
   selectively etching said insulating layer with an etching agent through said window.

6. A method according to claim 1, wherein said semiconductor circuit element to be formed is a metal oxide semiconductor field effect transistor circuit element.

7. A method according to claim 6 wherein said insulating layer is formed into an inverted mesa like shape.

8. A method of manufacturing a semiconductor device comprising the steps of:
   selectively masking a region of a silicon semiconductor substrate with an insulating layer of silicon dioxide, in which region a semiconductor circuit element is to be formed, said insulating layer formed into an inverted mesa like shape;
   etching the unmasked region of said silicon semiconductor substrate to form the unetched part of the silicon semiconductor substrate into a mesa like shape;
   forming an anti-oxidation masking layer over the entire surface of both said insulating layer and said silicon semiconductor substrate;
   bombarding said anti-oxidation masking layer with ions from a direction which is almost at a right angle to the surface of said silicon semiconductor substrate;
   selectively etching said anti-oxidation masking layer to leave a part of said anti-oxidation masking layer on the sides of the insulating layer and on the sides of said mesa shaped part of said silicon semiconductor substrate;
   oxidizing the unmasked region of said silicon semiconductor substrate to form a silicon dioxide field oxide layer;
   removing said insulating layer from said region of said silicon semiconductor substrate in which said circuit element is to be formed, thereby exposing said region;
   removing said anti-oxidation masking layer; and
   forming said circuit element in said exposed region.

* * * * *

UNITED STATES PATENT AND TRADEMARK OFFICE
CERTIFICATE OF CORRECTION

PATENT NO. : 4,292,156
DATED : September 29, 1981
INVENTOR(S) : MATSUMOTO ET AL.

It is certified that error appears in the above—identified patent and that said Letters Patent is hereby corrected as shown below:

```
Front page, [56] References Cited, U.S. Patent Documents,
     DeWerdt, change "X" to --XR--; Other Publications,
     change "Saki" to --Sakai--, and change "Transistor-
     SET" to --Transistor:SET--.
Column 1, line 37, after "particular" insert --,--;
         line 40, after "Thus" insert --,--;
         line 47, delete ",";
         line 53, after "Thus" insert --,--;
Column 2, line 54, after "(90°)" insert --,--;
Column 3, line 55, delete ",".
Column 4, line 20, delete both occurrences of ",".
Column 5, line 19, change "formed and," to --formed, and--.
Column 6, line 32, after "6" insert --,--.
```

Signed and Sealed this

Ninth Day of February 1982

[SEAL]

Attest:

GERALD J. MOSSINGHOFF

Attesting Officer

Commissioner of Patents and Trademarks